(12) United States Patent
Hung et al.

(10) Patent No.: US 11,146,273 B2
(45) Date of Patent: Oct. 12, 2021

(54) ELECTRONIC DEVICE AND ELECTRONIC PRODUCT

(71) Applicant: Realtek Semiconductor Corp., HsinChu (TW)

(72) Inventors: Chia-Chun Hung, HsinChu (TW); Chih-Wei Ho, HsinChu (TW); Chin-Wen Wang, HsinChu (TW); Liang-Hui Li, HsinChu (TW); Yi-Cheng Chen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/180,887

(22) Filed: Feb. 22, 2021

(65) Prior Publication Data

US 2021/0265998 A1    Aug. 26, 2021

Related U.S. Application Data

(60) Provisional application No. 62/981,037, filed on Feb. 25, 2020.

(30) Foreign Application Priority Data

Jan. 7, 2021    (TW) .................... 110100536

(51) Int. Cl.
| | |
|---|---|
| H03K 23/00 | (2006.01) |
| H03K 23/42 | (2006.01) |
| H03K 23/58 | (2006.01) |
| H03K 21/38 | (2006.01) |
| H03K 21/40 | (2006.01) |

(52) U.S. Cl.
CPC ............ *H03K 23/42* (2013.01); *H03K 21/38* (2013.01); *H03K 21/403* (2013.01); *H03K 21/406* (2013.01); *H03K 23/58* (2013.01)

(58) Field of Classification Search
None
See application file for complete search history.

(56) References Cited

U.S. PATENT DOCUMENTS

| | | | |
|---|---|---|---|
| 2009/0243866 A1* | 10/2009 | Murphy ................ | G06Q 50/06 340/635 |
| 2010/0176967 A1* | 7/2010 | Cumeralto ............. | H04Q 9/00 340/870.02 |

(Continued)

*Primary Examiner* — Tuan T Lam
(74) *Attorney, Agent, or Firm* — Winston Hsu

(57) ABSTRACT

The present invention provides an electronic device including a wireless communication module, a counter and a processing circuit. The wireless communication module is configured to receive a first packet and a second packet from another electronic device, wherein the first packet includes a first counter value, the second packet includes a second counter value, and the first counter value and the second counter value correspond to two adjacent edges of an original signal of another electronic device, respectively. The processing circuit is configured to obtain a third counter value from the counter when the first packet is received, and obtain a fourth counter value from the counter when the second packet is received; and the processing circuit further generates an output signal that is substantially the same as the original signal according to the first counter value, the second counter value, the third counter value and the fourth counter value.

14 Claims, 9 Drawing Sheets

(56) References Cited

U.S. PATENT DOCUMENTS

2012/0280833 A1\* 11/2012 Jonsson ................ G06F 13/385
                                                        340/870.02
2014/0277788 A1\* 9/2014 Forbes, Jr. ............ G06Q 50/06
                                                        700/286

\* cited by examiner

ELECTRONIC DEVICE AND ELECTRONIC PRODUCT

CROSS REFERENCE TO RELATED APPLICATIONS

This application claims the priority of U.S. Provisional Application No. 62/981,037 (filed on Feb. 25, 2020), which is included herein by reference in its entirety.

BACKGROUND OF THE INVENTION

1. Field of the Invention

The present invention relates to an electronic device and electronic product with wireless communication functions.

2. Description of the Prior Art

Electronic products are generally tested in a factory before they are sold to ensure that their functions and operations are normal. However, for some electronic products that cannot be physically connected for testing, such as wireless watt hour meter, wireless transmission is required to test whether signals in the electronic product are normal and accurate. Specifically, in a test phase of an electronic product, information of one or more internal signals needs to be transmitted to a measuring device through wireless transmission, so that the measuring device can determine correctness and accuracy of the internal signal(s) of the electronic product. However, since a frequency of a clock signal in an electronic system is easily affected by environmental factors (for example, temperature), the above-mentioned test process will cause measurement errors due to a difference between the clock signals of the electronic product and the measuring device. In addition, the signal delay of wireless transmission is also affected by environmental factors, and the measuring device cannot receive the signal-related information from the electronic product in real time, causing errors in the signal measurement.

SUMMARY OF THE INVENTION

It is therefore an objective of the present invention to provide an electronic device that can be used in a measuring device to accurately generate an output signal that is substantially the same as the internal signal of the electronic product for the signal measurement, to solve the above-mentioned problems.

According to one embodiment of the present invention, an electronic device comprising a wireless communication module, a counter and a processing circuit is disclosed. The wireless communication module is configured to receive a first packet and a second packet from another electronic device, wherein the first packet comprises at least a first counter value, the second packet comprises at least a second counter value, and the first counter value and the second counter value correspond to two adjacent edges of an original signal of another electronic device, respectively. The counter is configured to continuously counting based on a clock signal. The processing circuit is configured to obtain a third counter value from the counter when the first packet is received, and obtain a fourth counter value from the counter when the second packet is received; and the processing circuit further generates an output signal that is substantially the same as the original signal according to the first counter value, the second counter value, the third counter value, and the fourth counter value.

According to another embodiment of the present invention, an electronic product comprising a counter, a detection circuit and a wireless communication module is disclosed. The counter is configured to continuously count according to a clock signal. The detection circuit is configured to detect an original signal in a real-time manner, and obtain a first counter value from the counter when the rising edge of the original signal appears, and obtain a second counter value from the counter when a falling edge of the original signal appears. The a wireless communication module is configured to transmit the first counter value to an electronic device through a first packet after the detection circuit obtains the first counter value, and transmit the second counter value to the electronic device through a second packet after the detection circuit obtains the second counter value.

According to another embodiment of the present invention, an electronic device comprising a wireless communication module, a counter and a processing circuit is disclosed. The wireless communication module is configured to receive a first packet, a second packet, a third packet and a fourth packet from another electronic device, wherein the first packet comprises at least a first counter value, the second packet comprises at least a second counter value, the third packet comprises at least a third counter value, the fourth packet comprises at least a fourth counter value, the first counter value and the second counter value correspond to two adjacent edges of an original signal of the another electronic device, respectively, and the third counter value and the fourth counter value are respectively generated according to two packets sent by a wireless communication module of the another other electronic device. The counter is configured to continuously counting based on a clock signal. The processing circuit is configured to generate an output signal that is substantially the same as the original signal according to the first counter value, the second counter value, the third counter value, and the fourth counter value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
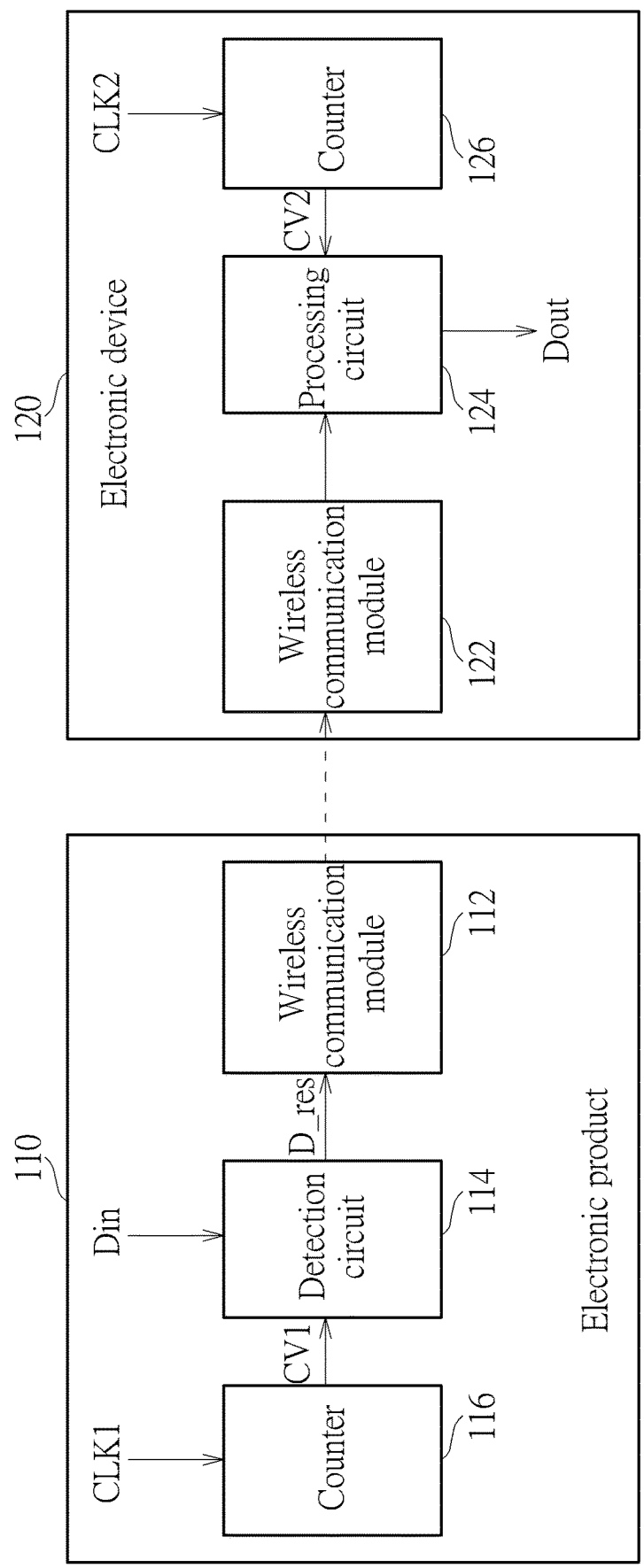
FIG. 1 is a diagram illustrating an electronic product and an electronic device according to one embodiment of the present invention.

FIG. 1 is a diagram illustrating an electronic product 110 and an electronic device 120 according to one embodiment of the present invention, wherein the electronic device 120 can be set in a measuring device to determine signal states of an original signal Din in the electronic product 110. As shown in FIG. 1, the electronic product 110 comprises a wireless communication module 112, a detection circuit 114 and a counter 116, and the electronic device 120 comprises a wireless communication module 122, a processing circuit 124 and a counter 126. The electronic product 110 can be a wireless watt hour meter, which can be installed in any environment where power is used and records the used power, and the original signal Din is used to indicate power consumption. The electronic device 120 is used to internally recreate an output signal Dout that is substantially the same as the original signal Din for determining a quality of the original signal Din.

When the electronic product 110 is in a test phase, the electronic product 110 receives the original signal Din from an external device, where the original signal Din is used to simulate a digital signal generated by the electronic product 110 in actual application, and the original signal Din can come from a measuring device including electronic device 120 (for example, the original signal Din may be transmitted through other interfaces). In addition, the counter 116 may be a free-run counter, which can continuously generate counter values CV1 according to a clock signal CLK1. Then, the detection circuit 114 detects the original signal Din to determine whether the original signal Din has a change in voltage level, that is, to determine whether the original signal Din has an edge on the waveform, to generate a detection result D_res. In detail, when the detection circuit 114 detects that the original signal Din changes from a low level to a high level, the detection circuit 114 will get a current counter value CV1 from the counter 116 to obtain a first counter value for generating the detection result D_res, and detection circuit 114 sends the detection result D_res to the electronic device 120 through the wireless communication module 112, where the detection result D_res at this time includes the first counter value corresponding to the rising edge of the original signal Din. In addition, when the detection circuit 114 detects that the original signal Din changes from a high level to a low level, the detection circuit 114 will get the current counter value CV1 from the counter 116 to obtain a second counter value for generating the detection result D_res, and detection circuit 114 sends the detection result D_res to the electronic device 120 through the wireless communication module 112, where the detection result D_res at this time includes the second counter value corresponding to the falling edge of the original signal Din. In summary, whenever the detection circuit 114 detects that the original signal Din has a rising edge or a falling edge, the detection circuit 114 will instantly get the counter value CV1 of the counter 116 and generate the detection result D_res comprising the counter value and corresponding rising edge or the falling edge information to the electronic device 120. In this embodiment, when the detection circuit 114 detects that the original signal Din has a rising edge or a falling edge, the detection circuit 114 will immediately transmit the corresponding detection result D_res to the electronic device 120, therefore, no matter how close the rising edge and falling edge of the original signal Din is, a packet will only contain the counter value of only one edge of the original signal Din. However, the present invention is not limited to this.

In the operation of the electronic device 120, the wireless communication module 122 continuously receives a plurality of packets from the electronic product 110, and some of the plurality of packets include the detection result D_res generated by the electronic product 110. In addition, the counter 126 may be a free-run counter, which can continuously generate the counter value CV2 according to a clock signal CLK2. When the processing circuit 124 receives a signal with the detection result D_res through the wireless communication module 122, the processing circuit 124 will immediately obtain the counter value CV2 from the counter 126 for subsequent calculations. Specifically, when the processing circuit 124 receives information of the rising edge of the original signal Din and the corresponding first counter value through the wireless communication module 122, the processing circuit 124 gets the current counter value CV2 from the counter 126 to obtain a third counter value; and when the processing circuit 124 receives information of the falling edge of the original signal Din and the corresponding second counter value through the wireless communication module 122, the processing circuit 124 gets the current counter value CV2 from the counter 126 to obtain a fourth counter value. Finally, the processing circuit 124 generates the output signal Dout that is the same as the original signal Din according to the first counter value and the second counter value from the electronic product 110, the third counter value and the fourth counter value obtained by the electronic device 120 itself, and a time interval between the two signals (packets) comprising the detection result D_res.

Figure 2:
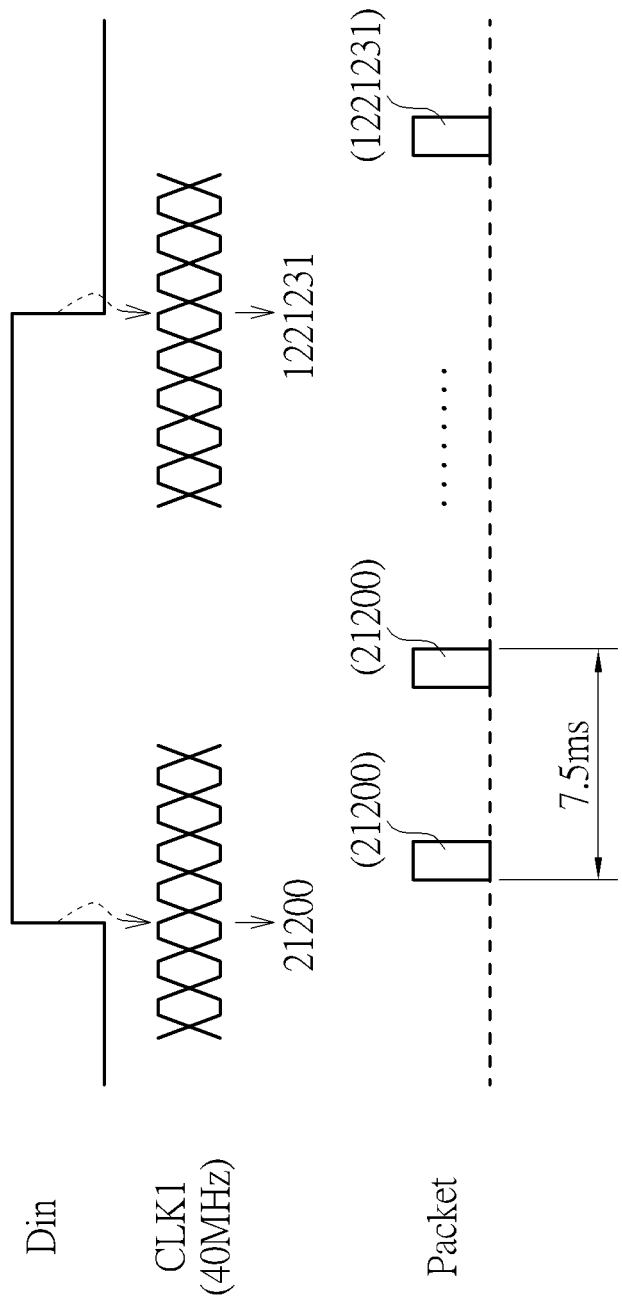
FIG. 2 is a diagram of the electronic product generating a packet having a first counter value and a packet having a second counter value.
Figure 3:
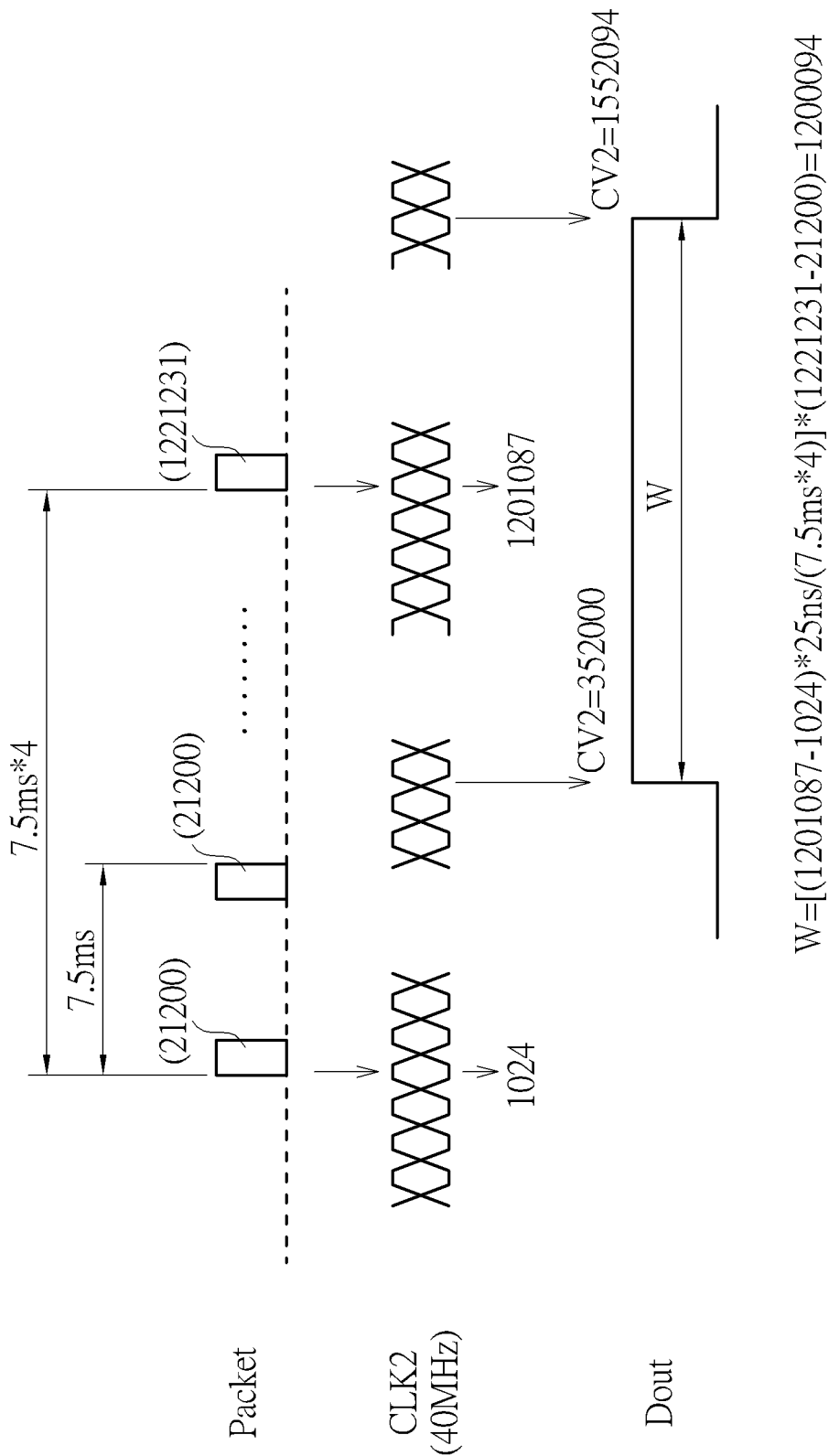
FIG. 3 is a diagram of the electronic device generating a third counter value and a fourth counter value, and generating an output signal accordingly.

Take FIG. 2 and FIG. 3 as an example for description, where FIG. 2 is a diagram of the electronic product 110 generating a packet having a first counter value and a packet having a second counter value, and FIG. 3 is a diagram of the electronic device 120 generating a third counter value and a fourth counter value, and generating the output signal Dout accordingly. In the following description, it is assumed that both the electronic product 110 and the electronic device 120 support a Bluetooth Low Energy (BLE) specification, and the wireless communication module 112 in the electronic product 110 transmits Bluetooth packets to the wireless communication module 122 of electronic device 120. Referring to FIG. 2, the first counter value obtained by the detection circuit 114 when detecting the rising edge of the original signal Din is "21200", and the electronic product 110 will immediately send the packet containing the first counter value to the electronic device 120, and if the packet transmission fails (for example, the electronic product 110 does not receive the acknowledgement information (ACK) from the electronic device 120), the electronic product 110 will resend the packet containing the first counter value to the electronic device 120 after a fixed time interval. It is noted that the packet transmission interval is 7.5 milliseconds (ms) in this embodiment, but this is only an example and not a limitation of the present invention. The packet transmission interval can be set based on connection negotiation between the electronic product 110 and the electronic device 120. Then, the second counter value obtained by the detection circuit 114 when detecting the falling edge of the original signal Din is "1221231", and the electronic product 110 immediately transmits the packet containing the second counter value to the electronic device 120.

Then, referring to FIG. 3, assuming that the electronic device 120 successfully receives the packet containing the first counter value when the electronic product 110 first transmits, the processing circuit 124 will get the current counter value from the counter 126 to obtain the third counter value "1024". In addition, when the processing circuit 124 receives the packet containing the second counter value transmitted from the electronic product 110, the processing circuit 124 will get the current counter value from the counter 126 to obtain the fourth counter value "1201087". Then, assuming that the frequencies of the clock signal CLK1 and the clock signal CLK2 are both 40 MHz, a width of each clock cycle is 25 nanoseconds (ns), and the electronic product 110 sends the packet containing the first counter value for the first time is regarded as a first packet, the packet containing the second counter value sent by the electronic product 110 is the fifth packet, and a time interval for transmitting two adjacent packets is 7.5 ms, then a width W of a high voltage level of the waveform of the output signal Dout can be calculated as follows:

$$W=[(1201087-1024)*25 \text{ ns}/(7.5 \text{ ms}*4)]*(1221231-21200)=1200094 \quad (1)$$

wherein "(1221231−21200)*25 ns" represents a width of a high voltage level of the original signal Din, and the calculated width W represents the width of the high voltage level of the original signal Din when the clock signal CLK2 is used for counting. Therefore, after determining the width W of the output signal Dout, the processing circuit 124 can accurately create the output signal Dout that is the same as the original signal Din according to the counter value CV2 of the counter 126. For example, FIG. 3 shows that when the counter value CV2 is "352000", the output signal Dout is controlled to change from low level to high level, and when the counter value CV2 is "1352094", the output signal Dout is controlled to change from high level to low level.

It should be noted that, in the example shown in FIG. 3, it is assumed that the electronic device 120 successfully receives the packet containing the first counter value transmitted by the electronic product 110 for the first time. If the electronic device 120 successfully receives the packet containing the first counter value for the second time by the electronic product 110, the "7.5 ms*4" in the above formula (1) should be modified to "7.5 ms*3", and the third counter value "1024" should also be modified to the counter value when the second packet is received. Since a person skilled in the art should be able to understand how to modify the content of formula (1) to apply to the case of packet retransmission after reading the above description, the detailed descriptions are omitted here.

In this embodiment, when the electronic product 110 is a wireless watt hour meter, the width of the high voltage level of the original signal Din represents the power consumption. Therefore, by using the method of the above embodiment, the electronic device 120 can still accurately regenerate the original signal Din for subsequent applications even if actual frequencies of the clock signal CLK1 and the clock signal CLK2 are different due to manufacturing process or environmental factors.

On the other hand, during the test phase of the electronic product 110, since the original signal Din of the electronic product is a known signal inputted from the external device, and the output signal Dout generated by the electronic device 120 can be completely the same as the original signal Din, therefore, the electronic device 120 itself can determine whether there is a problem with the internal operation of the electronic product 110 by comparing the output signal Dout with the above known signal, so as to detect the quality of the internal signal of the electronic product 110.

Figure 4:
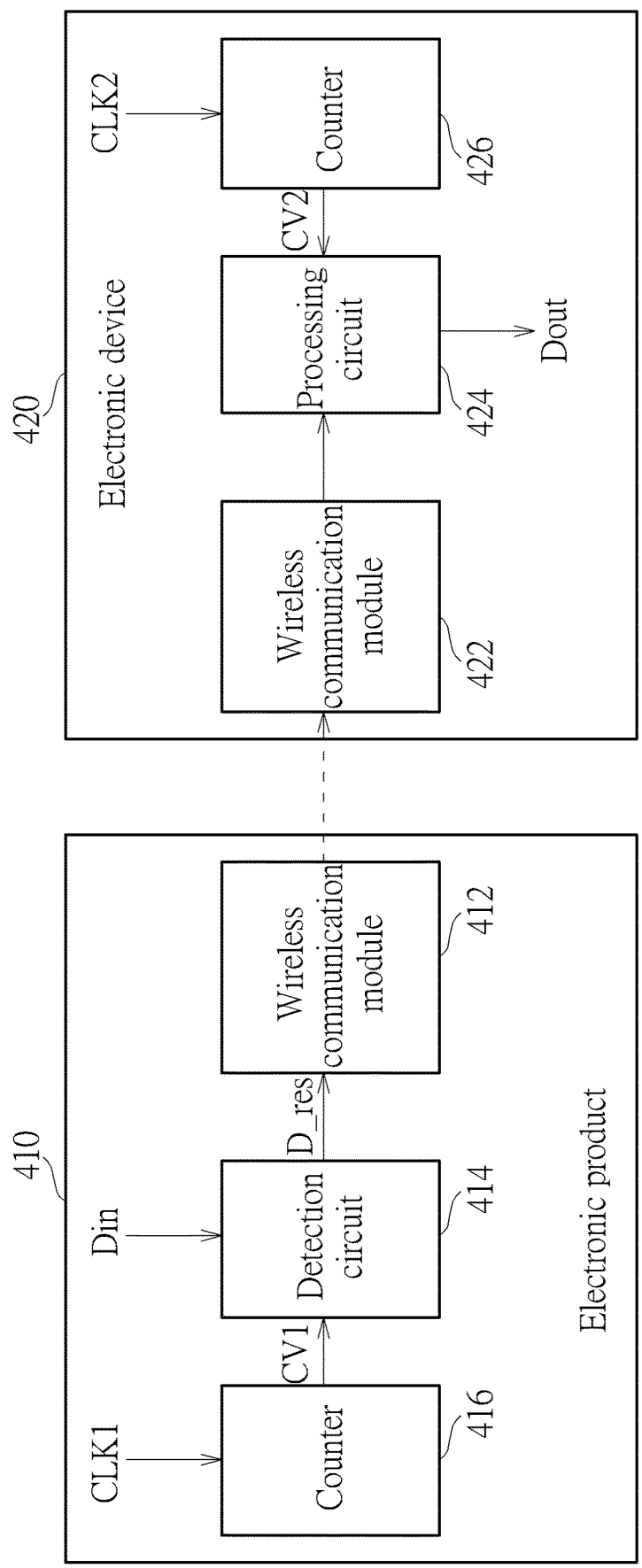
FIG. 4 is a diagram illustrating an electronic product and an electronic device according to another embodiment of the present invention.

FIG. 4 is a diagram illustrating an electronic product 410 and an electronic device 420 according to one embodiment of the present invention, wherein the electronic device 420 can be set in a measuring device to determine signal states of an original signal Din in the electronic product 410. As shown in FIG. 4, the electronic product 410 comprises a wireless communication module 412, a detection circuit 414 and a counter 416, and the electronic device 420 comprises a wireless communication module 422, a processing circuit 424 and a counter 426. The electronic product 410 can be a wireless watt hour meter, which can be installed in any environment where power is used and records the used power, and the original signal Din is used to indicate power consumption. The electronic device 420 is used to internally recreate an output signal Dout that is substantially the same as the original signal Din for determining a quality of the original signal Din.

When the electronic product 410 is in a test phase, the electronic product 410 receives the original signal Din from an external device, where the original signal Din is used to simulate a digital signal generated by the electronic product 410 in actual application, and the original signal Din can come from a measuring device including electronic device 420 (for example, the original signal Din may be transmitted through other interfaces). In addition, the counter 416 may be a free-run counter, which can continuously generate counter values CV1 according to a clock signal CLK1. Then, the detection circuit 114 detects the original signal Din to determine whether the original signal Din has a change in voltage level, that is, to determine whether the original signal Din has an edge on the waveform, to generate a detection result D_res. In detail, when the detection circuit 114 detects that the original signal Din changes from a low level to a high level, then the detection circuit 114 will get a current counter value CV1 from the counter 116 to obtain a first counter value for generating the detection result D_res, and detection circuit 114 sends the detection result D_res to the electronic device 120 through the wireless communication module 112, where the detection result D_res at this time includes the first counter value corresponding to the rising edge of the original signal Din. In this embodiment, if the packet transmission of the electronic product 410 fails, before the packet is retransmitted, the detection circuit 414 will additionally get the current counter value CV1 from the counter 416 to obtain an updated first counter value, and the updated first counter value and the previous first counter value are sent to the electronic device 420 through a new packet. In addition, when the detection circuit 414 detects that the original signal Din changes from a high level to a low level, the detection circuit 414 will get the current counter value CV1 from the counter 416 to obtain a second counter value for generating the detection result D_res, and detection circuit 414 sends the detection result D_res to the electronic device 120 through the wireless communication module 412, where the detection result D_res at this time includes the second counter value corresponding to the falling edge of the original signal Din. In this embodiment, if the packet transmission of the electronic product 410 fails, before the packet is retransmitted, the detection circuit 414 will additionally get the current counter value CV1 from the counter 416 to obtain an updated second counter value, and the updated second counter value and the previous second counter value are sent to the electronic device 420 through a new packet. In summary, whenever the detection circuit 414 detects that the original signal Din has a rising edge or a falling edge, the detection circuit 414 will instantly get the counter value CV1 of the counter 416 and generate the detection result D_res comprising the counter value and corresponding rising edge or the falling edge information to the electronic device 420. In this embodiment, when the detection circuit 414 detects that the original signal Din has a rising edge or a falling edge, the detection circuit 414 will immediately transmit the corresponding detection result D_res to the electronic device 420, therefore, no matter how close the rising edge and falling edge of the original signal Din is, a packet will only contain the counter value (or the counter value with the updated counter value) of only one edge of the original signal Din. However, the present invention is not limited to this.

In the operation of the electronic device 420, the wireless communication module 422 continuously receives a plurality of packets from the electronic product 410, and some of the plurality of packets include the detection result D_res generated by the electronic product 410. In addition, the counter 426 may be a free-run counter, which can continuously generate the counter value CV2 according to a clock signal CLK2. When the processing circuit 424 receives a signal with the detection result D_res through the wireless communication module 422, the processing circuit 424 will immediately obtain the counter value CV2 from the counter 426 for subsequent calculations. Specifically, when the processing circuit 424 receives information of the rising edge of the original signal Din and the corresponding first counter value through the wireless communication module 422, the processing circuit 424 gets the current counter value CV2 from the counter 426 to obtain a third counter value; and when the processing circuit 424 receives information of the falling edge of the original signal Din and the corresponding second counter value through the wireless communication module 422, the processing circuit 424 gets the current counter value CV2 from the counter 426 to obtain a fourth counter value. Finally, the processing circuit 424 generates the output signal Dout that is the same as the original signal Din according to the first counter value and the second counter value from the electronic product 410, the updated first counter value and the updated second counter value from the electronic product 410 (in any), and the third counter value and the fourth counter value obtained by the electronic device 420 itself.

Figure 5:
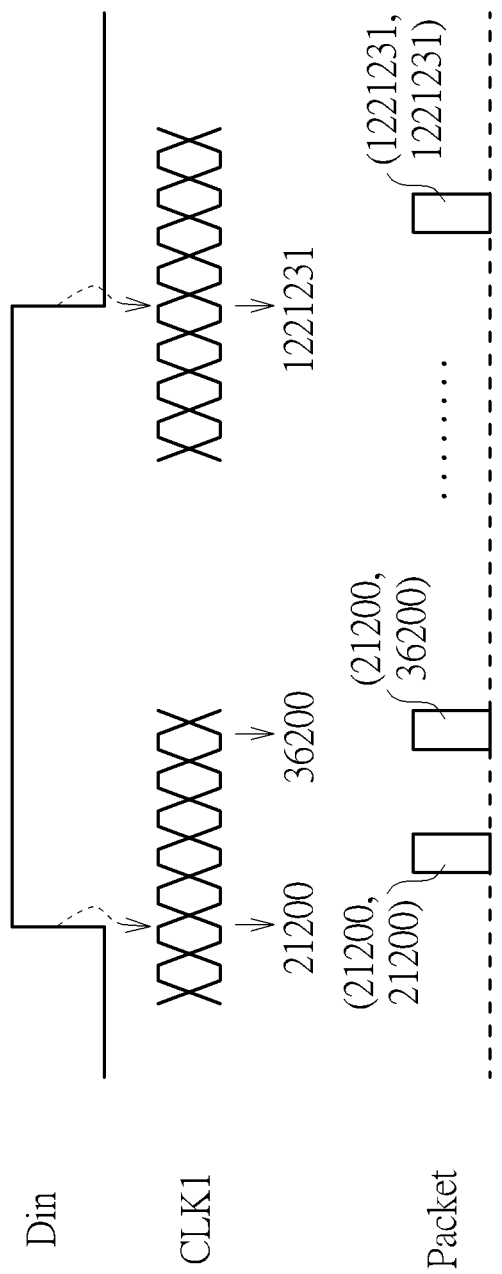
FIG. 5 is a diagram of the electronic product in FIG. 4 generating a packet having a first counter value and a packet having a second counter value.
Figure 6:
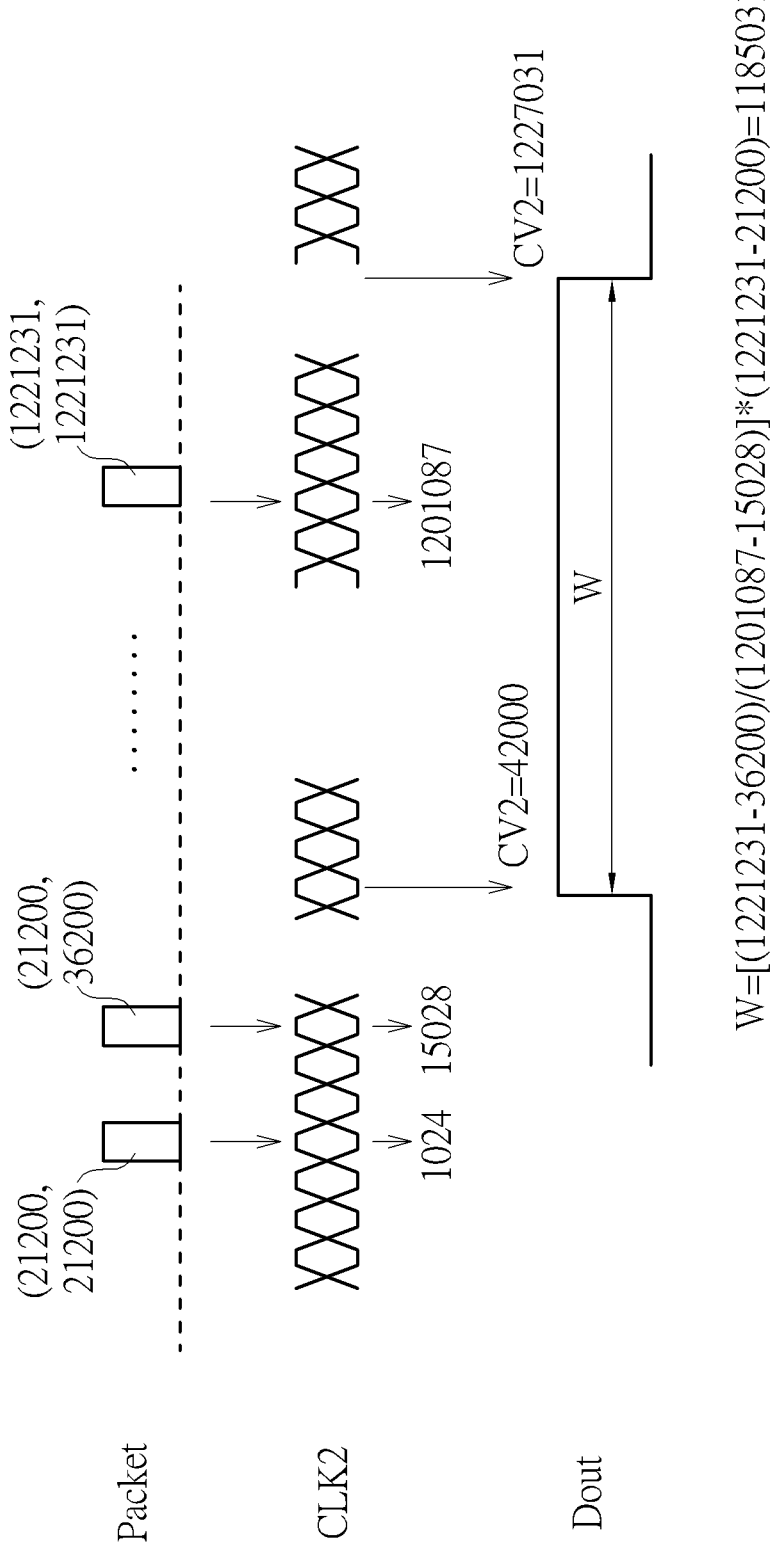
FIG. 6 is a diagram of the electronic device in FIG. 4 generating a third counter value and a fourth counter value, and generating an output signal accordingly.

Take FIG. 5 and FIG. 6 as an example for description, where FIG. 5 is a diagram of the electronic product 410 generating a packet having a first counter value and a packet having a second counter value, and FIG. 6 is a diagram of the electronic device 420 generating a third counter value and a fourth counter value, and generating the output signal Dout accordingly. In the following description, it is assumed that the electronic product 410 and the electronic device 420 do not have a fixed packet transmission interval, that is, the electronic product 410 can transmit packets to the electronic device 420 at any time, without the need for a fixed packet transmission interval as set in BLE specification. In one embodiment, the electronic product 410 and the electronic device 420 support a Nordic 2.4 GHz specification. Referring to FIG. 5, the first counter value obtained by the detection circuit 414 when detecting the rising edge of the original signal Din is "21200", and the electronic product 410 will immediately send the packet containing the first counter value to the electronic device 420, and if the packet transmission fails (for example, the electronic product 410 does not receive an ACK from the electronic device 420), the detection circuit 414 will obtain the current counter value CV1 from the counter 416 as the updated first counter value (for example, "36200" in FIG. 5), and the detection circuit 414 immediately transmits the first counter value "21200" and the updated first counter value "36200" to the electronic device 420, that is, the updated first counter value "36200" can be regarded as the time point corresponding to the retransmitted packet. Then, the second counter value obtained by the detection circuit 414 when detecting the falling edge of the original signal Din is "1221231", and the electronic product 410 immediately transmits the packet containing the second counter value to the electronic device 420.

Then, referring to FIG. 6, since the electronic product 420 successfully receives the packet when the electronic product 410 transmits the packet containing the first counter value for the second time, the processing circuit 424 will get the current counter value from the counter 426 to obtain the third counter value "15028"; in addition, when the processing circuit 424 receives a packet containing the second counter value from the electronic product 410, the processing circuit 424 will get the current counter value from the counter to obtain the fourth counter value "1201087". Then, a width W of a high voltage level of the waveform of the output signal Dout can be calculated as follows:

$$W=[(1221231-36200)/(1201087-15028)]*(1221231-21200)=1185031. \quad (2);$$

wherein the calculated width W represents the width of the high voltage level of the original signal Din when the clock signal CLK2 is used for counting. Therefore, after determining the width W of the output signal Dout, the processing circuit 124 can accurately create the output signal Dout that is the same as the original signal Din according to the counter value CV2 of the counter 426. For example, FIG. 6 shows that when the counter value CV2 is "42000", the output signal Dout is controlled to change from low level to high level, and when the counter value CV2 is "1227031", the output signal Dout is controlled to change from high level to low level.

It should be noted that, in the example shown in FIGS. 5 and 6, it is assumed that the electronic device 420 successfully receives the packet containing the first counter value transmitted by the electronic product 410 for the second time. If the electronic device 420 successfully receives the packet containing the first counter value transmitted by the electronic product 410 for the first time, the updated first counter value "36200" in the above formula (2) should be modified to "21200", and the third counter value "15028" should also be modified to the counter value "1024" when the first packet is received. Since a person skilled in the art should be able to understand how to modify the content of formula (2) to apply to the case of packet retransmission after reading the above description, the detailed descriptions are omitted here.

Figure 7:
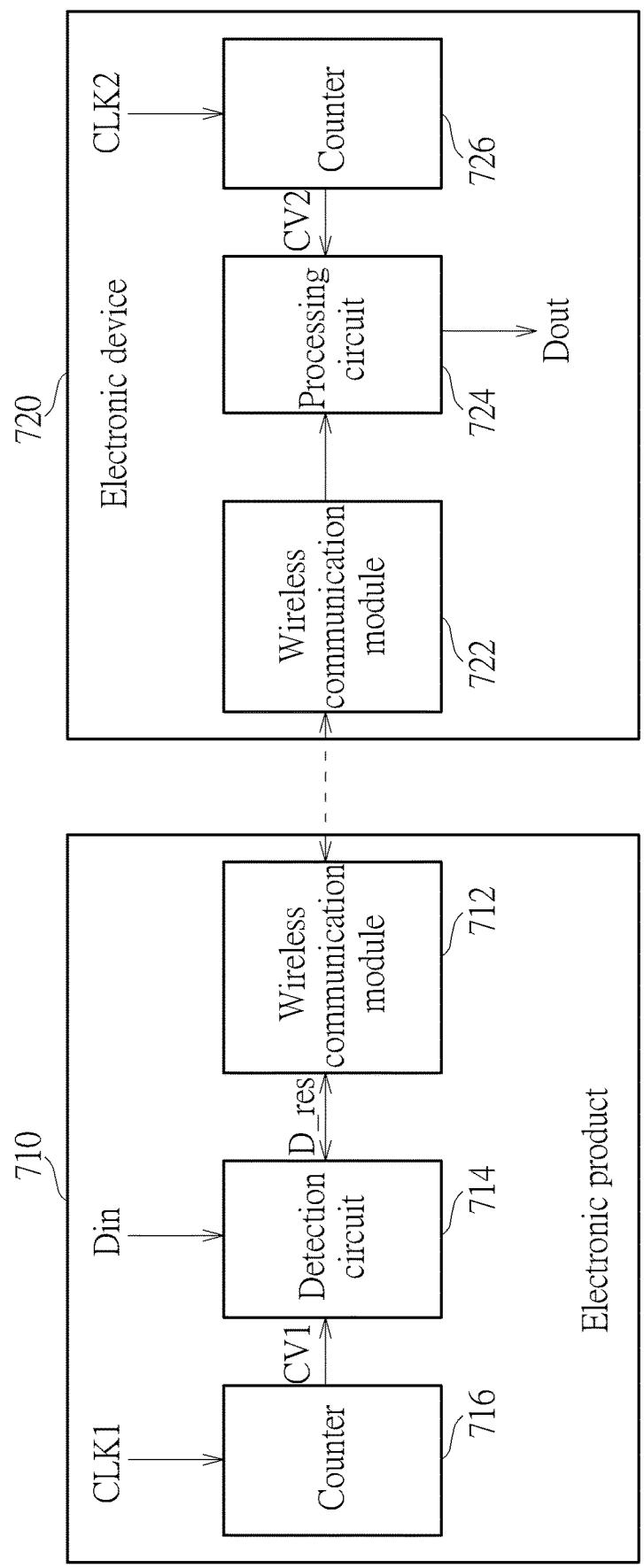
FIG. 7 is a diagram illustrating an electronic product and an electronic device according to another embodiment of the present invention.

FIG. 7 is a diagram illustrating an electronic product 710 and an electronic device 720 according to one embodiment of the present invention, wherein the electronic device 720 can be set in a measuring device to determine signal states of an original signal Din in the electronic product 710. As shown in FIG. 7, the electronic product 710 comprises a wireless communication module 712, a detection circuit 714 and a counter 716, and the electronic device 720 comprises a wireless communication module 722, a processing circuit 724 and a counter 726. The electronic product 710 can be a wireless watt hour meter, which can be installed in any environment where power is used and records the used power, and the original signal Din is used to indicate power consumption. The electronic device 720 is used to internally recreate an output signal Dout that is substantially the same as the original signal Din for determining a quality of the original signal Din.

When the electronic product 710 is in a test phase, the electronic product 710 receives the original signal Din from an external device, where the original signal Din is used to simulate a digital signal generated by the electronic product 710 in actual application, and the original signal Din can come from a measuring device including electronic device 720 (for example, the original signal Din may be transmitted through other interfaces). In addition, the counter 716 may be a free-run counter, which can continuously generate counter values CV1 according to a clock signal CLK1. Then, the detection circuit 714 detects the original signal Din to determine whether the original signal Din has a change in voltage level, that is, to determine whether the original signal Din has an edge on the waveform, to generate a detection result D_res. In detail, when the detection circuit 714 detects that the original signal Din changes from a low level to a high level, the detection circuit 714 will get a current counter value CV1 from the counter 716 to obtain a first counter value for generating the detection result D_res, and detection circuit 714 sends the detection result D_res to the electronic device 720 through the wireless communication module 712, where the detection result D_res at this time includes the first counter value corresponding to the rising edge of the original signal Din. In addition, when the detection circuit 714 detects that the original signal Din changes from a high level to a low level, the detection circuit 714 will get the current counter value CV1 from the counter 716 to obtain a second counter value for generating the detection result D_res, and detection circuit 714 sends the detection result D_res to the electronic device 720 through the wireless communication module 712, where the detection result D_res at this time includes the second counter value corresponding to the falling edge of the original signal Din. In summary, whenever the detection circuit 714 detects that the original signal Din has a rising edge or a falling edge, the detection circuit 714 will instantly get the counter value CV1 of the counter 716 and generate the detection result D_res comprising the counter value and corresponding rising edge or the falling edge information to the electronic device 720. In this embodiment, when the detection circuit 714 detects that the original signal Din has a rising edge or a falling edge, the detection circuit 714 will immediately transmit the corresponding detection result D_res to the electronic device 720.

In the operation of the electronic device 720, the wireless communication module 722 will generate a packet into the electronic product 710 for the electronic product 710 to generate a third counter value and a fourth counter value. Specifically, it is assumed that both the electronic product 710 and the electronic device 720 support the BLE specification, and the electronic device 720 can transmit multiple Bluetooth packets to the wireless communication module 712 of the electronic product 710, and the detection circuit 714 will get the current counter value CV1 from the counter 716 to obtain the third counter value for generating the detection result D_res when the electronic product 710 receives one packet, and the detection circuit 714 sends the detection result D_res to the electronic device 720 through the wireless communication module 712. In addition, when the electronic product 710 receives another packet, the detection circuit 714 will get the current counter value CV1 from the counter 716 to obtain the fourth counter value for generating the detection result D_res, and the detection circuit 714 sends the detection result D_res to the electronic device 720 through the wireless communication module 712. It is noted that when the electronic product 710 transmits the third counter value and the fourth counter value to the electronic device 720, the Bluetooth packet information of the corresponding electronic device 720 is also transmitted (for example, the first packet and the fifth packet shown in FIG. 8).

Then, the processing circuit 724 generates the output signal Dout which is the same as the original signal Din according to the first counter value, the second counter value, the third counter value and the fourth counter value from the electronic product 710, and a time interval between two Bluetooth packets corresponding to the third counter value and the fourth counter value.

Figure 8:
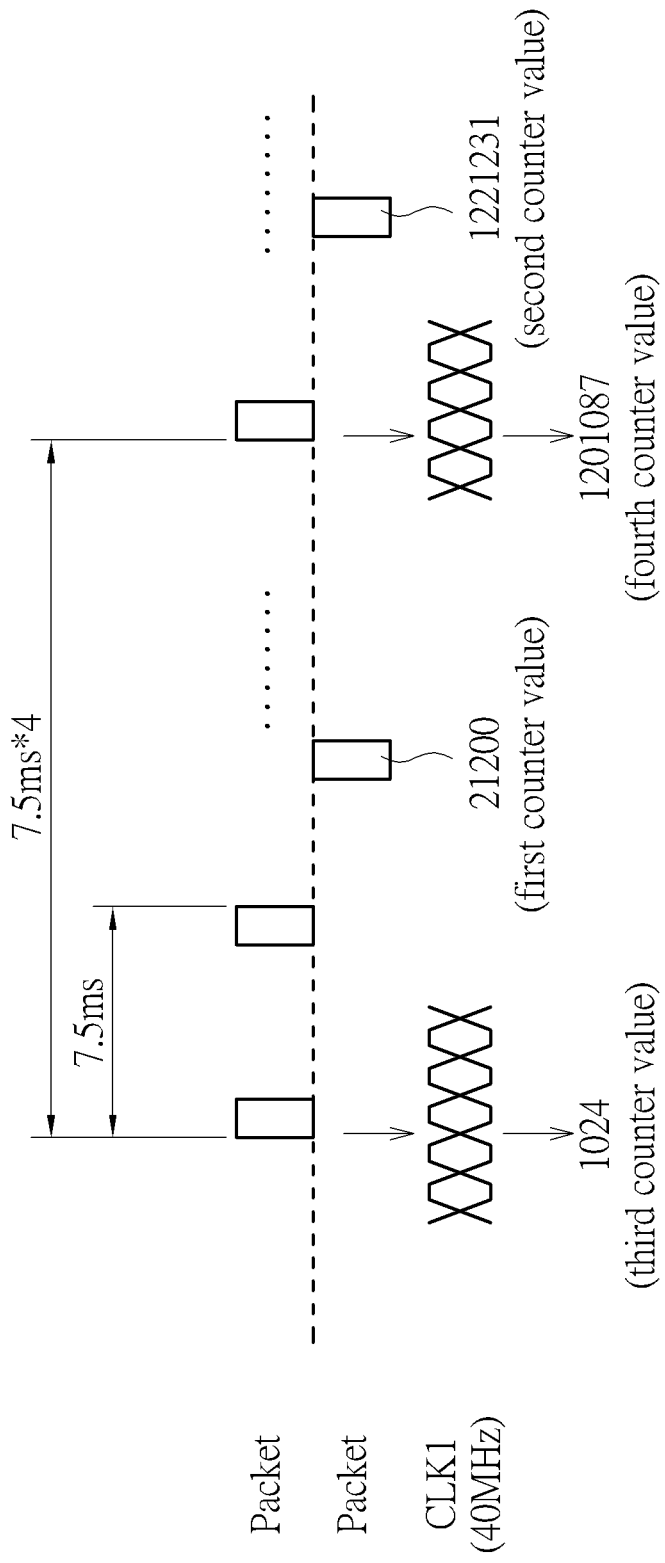
FIG. 8 is a diagram of the electronic product in FIG. 7 generating a first counter value, a second counter value, a third counter value and a fourth counter value.
Figure 9:
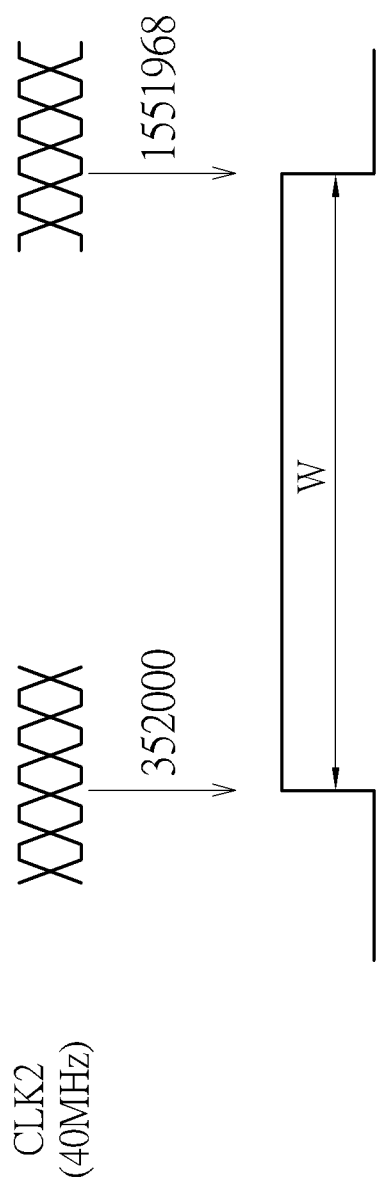
FIG. 9 is a diagram of the electronic device in FIG. 7 generating an output signal.

Take FIG. 8 and FIG. 9 as an example for description, where FIG. 8 is a diagram of the electronic product 710 generating a first counter value, a second counter value, a third counter value and a fourth counter value and FIG. 9 is a diagram of the electronic device 720 generating the output signal Dout. Referring to FIG. 8, the first counter value obtained when the detection circuit 714 detects the rising edge of the original signal Din is "21200", and the second counter value obtained when the detection circuit 714 detects the falling edge of the original signal Din is "1221231". In addition, the third counter value obtained by the detection circuit 714 when receiving the first Bluetooth packet from the electronic device 720 is "1024", and the fourth counter value obtained by the detection circuit 714 when receiving the fifth Bluetooth packet from the electronic device 720 is "1201087". Then, referring to FIG. 9, assuming that the frequencies of the clock signal CLK1 and the clock signal CLK2 are both 40 MHz, a width of each clock cycle is 25 nanoseconds (ns), and a time interval for transmitting two adjacent packets is 7.5 ms, then a width W of a high voltage level of the waveform of the output signal Dout can be calculated as follows:

$$W=(7.5\ ms*4)*(1221231-21200)/[(1201087-1024)*25\ ns] \quad (3).$$

Therefore, after determining the width W of the output signal Dout, the processing circuit 724 can accurately create the output signal Dout that is the same as the original signal Din according to the counter value CV2 of the counter 726. For example, FIG. 9 shows that when the counter value CV2 is "352000", the output signal Dout is controlled to change from low level to high level, and when the counter value CV2 is "1551968", the output signal Dout is controlled to change from high level to low level.

Briefly summarized, in the electronic device and electronic product of the present invention, the electronic product obtains a first counter value from the counter when a rising edge of an original signal appears, and obtains a second counter value from the counter when a falling edge of the original signal appears, and the electronic product sends the first counter value and the second counter value to the electronic device through a first packet and a second packet, respectively. In addition, the electronic device obtains a third counter value from the internal counter when receiving the first packet, and obtains a fourth counter value from the internal counter when receiving the second packet. By using the first counter value, the second counter value, the third counter value, the fourth counter value and/or other time information for calculation, the original signal can be accurately regenerated without being affected by the error between internal clock signals of the electronic device and the electronic product. In another embodiment, all of the first counter value, second counter value, third counter value and fourth counter value can be generated by electronic product, and then the first counter value, the second counter value, the third counter value and the fourth counter value are transmitted to the electronic device to generate the output signal that is substantially the same as the original signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
   a wireless communication module, configured to receive a first packet and a second packet from another electronic device, wherein the first packet comprises at least a first counter value, the second packet comprises at least a second counter value, and the first counter value and the second counter value correspond to two adjacent edges of an original signal of another electronic device, respectively;
   a counter, configured to continuously counting based on a clock signal; and
   a processing circuit, coupled to the wireless communication module and the counter, configured to obtain a third counter value from the counter when the first packet is received, and obtain a fourth counter value from the counter when the second packet is received; and the processing circuit further generates an output signal that is substantially the same as the original signal according to the first counter value, the second counter value, the third counter value, and the fourth counter value.

2. The electronic device of claim 1, wherein the processing circuit calculates a time interval between two adjacent edges of the output signal according to a difference between the first counter value and the second counter value and a difference between the third counter value and the fourth counter value, to generate the output signal.

3. The electronic device of claim 2, wherein the processing circuit calculates a time interval between the two adjacent edges of the output signal according to a difference between the first counter value and the second counter value, a difference between the third counter value and the fourth counter value, a width of one cycle of the clock signal and a time interval between the processing circuit receiving the first packet and the second packet.

4. The electronic device of claim 1, wherein the wireless communication module supports a Bluetooth Low Energy (BLE) specification.

5. The electronic device of claim 1, wherein the first packet comprises the first counter value and an updated first counter value, the first packet is a retransmission packet of a previous packet, the previous packet comprises the first counter value, and the updated first counter value corresponds to a time immediately before the first packet starts to be transmitted.

6. The electronic device of claim 5, wherein the processing circuit further generates the output signal that is substantially the same as the original signal according to the first counter value, the updated first counter value, the second counter value, the third counter value and the fourth counter value.

7. The electronic device of claim 6, wherein the processing circuit calculates a time interval between two adjacent edges of the output signal according to a difference between the first counter value and the second counter value, a difference between the third counter value and the fourth counter value and a difference between the updated first counter value and the second counter value, to generate the output signal.

8. An electronic product, comprising:
   a counter, configured to continuously count according to a clock signal;
   a detection circuit, configured to detect an original signal in a real-time manner, and obtain a first counter value from the counter when the rising edge of the original signal appears, and obtain a second counter value from the counter when a falling edge of the original signal appears; and
   a wireless communication module, configured to transmit the first counter value to an electronic device through a first packet after the detection circuit obtains the first counter value, and transmit the second counter value to the electronic device through a second packet after the detection circuit obtains the second counter value.

9. The electronic product of claim 8, wherein when a transmission of the first packet fails, the detection circuit obtains an updated first counter value from the counter, and the detection circuit transmits the first counter value and the updated first counter value to the electronic device through another packet.

10. The electronic product of claim 8, wherein the electronic product is a wireless watt hour meter.

11. An electronic device, comprising:
    a wireless communication module, configured to receive a first packet, a second packet, a third packet and a fourth packet from another electronic device, wherein the first packet comprises at least a first counter value, the second packet comprises at least a second counter value, the third packet comprises at least a third counter value, the fourth packet comprises at least a fourth counter value, the first counter value and the second counter value correspond to two adjacent edges of an original signal of the another electronic device, respectively, and the third counter value and the fourth counter value are respectively generated according to two packets sent by a wireless communication module of the another other electronic device;
    a counter, configured to continuously counting based on a clock signal; and
    a processing circuit, coupled to the wireless communication module and the counter, configured to generate an output signal that is substantially the same as the original signal according to the first counter value, the second counter value, the third counter value, and the fourth counter value.

12. The electronic device of claim 11, wherein the processing circuit calculates a time interval between two adjacent edges of the output signal according to a difference between the first counter value and the second counter value and a difference between the third counter value and the fourth counter value, to generate the output signal.

13. The electronic device of claim 12, wherein the processing circuit calculates a time interval between the two adjacent edges of the output signal according to a difference between the first counter value and the second counter value, a difference between the third counter value and the fourth counter value, a width of one cycle of the clock signal and a time interval between the two packets.

14. The electronic device of claim 11, wherein the wireless communication module supports a Bluetooth Low Energy (BLE) specification.

\* \* \* \* \*